(12) United States Patent
Jawarani et al.

(10) Patent No.: US 7,262,105 B2
(45) Date of Patent: Aug. 28, 2007

(54) SEMICONDUCTOR DEVICE WITH SILICIDED SOURCE/DRAINS

(75) Inventors: Dharmesh Jawarani, Round Rock, TX (US); Nigel G. Cave, Austin, TX (US); Michael Rendon, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 165 days.

(21) Appl. No.: 10/718,892

(22) Filed: Nov. 21, 2003

(65) Prior Publication Data

US 2005/0112829 A1    May 26, 2005

(51) Int. Cl.
  *H01L 21/336*    (2006.01)
  *H01L 21/425*    (2006.01)
  *H01L 21/44*    (2006.01)

(52) U.S. Cl. ............... 438/301; 438/527; 438/660; 438/682

(58) Field of Classification Search ............... 438/369, 438/373, 514, 527, 301, 660, 663, 664, 682
See application file for complete search history.

(56) References Cited

U.S. PATENT DOCUMENTS

| | | | | |
|---|---|---|---|---|
| 4,243,433 A | * | 1/1981 | Gibbons | 438/528 |
| 5,296,387 A | * | 3/1994 | Aronowitz et al. | 438/301 |
| 5,475,244 A | * | 12/1995 | Koizumi et al. | 257/192 |
| 5,506,427 A | * | 4/1996 | Imai | 257/197 |
| 5,770,512 A | * | 6/1998 | Murakoshi et al. | 438/520 |
| 6,399,452 B1 | * | 6/2002 | Krishnan et al. | 438/305 |
| 6,486,062 B1 | * | 11/2002 | Kluth et al. | 438/682 |
| 6,706,614 B1 | * | 3/2004 | An et al. | 438/429 |
| 6,797,593 B2 | * | 9/2004 | Chakravarthi et al. | 438/514 |
| 6,911,706 B2 | * | 6/2005 | Hwang et al. | 257/408 |
| 2002/0187614 A1 | * | 12/2002 | Downey | 438/407 |
| 2003/0087504 A1 | * | 5/2003 | Erokhin et al. | 438/407 |
| 2005/0054164 A1 | * | 3/2005 | Xiang | 438/285 |

OTHER PUBLICATIONS

Ohguro et al., "Nitrogen-doped Nickel Monosilicide Technique for Deep Submicron CMOS Salicide," IEEE 1995, pp. 453-456.

* cited by examiner

*Primary Examiner*—Carl Whitehead, Jr.
*Assistant Examiner*—Heather Doty
(74) *Attorney, Agent, or Firm*—James L. Clingan, Jr.; David G. Dolezal

(57) ABSTRACT

In a semiconductor device, a relatively deep germanium implant and activation thereof precedes deposition of the nickel for nickel silicide formation. The activation of the germanium causes the lattice constant in the region of the implant to be increased over the lattice constant of the background substrate, which is preferably silicon. The effect is that the lattice so altered avoids formation of nickel disilicide. The result is that the nickel silicide spiking is avoided.

25 Claims, 4 Drawing Sheets

SEMICONDUCTOR DEVICE WITH SILICIDED SOURCE/DRAINS

FIELD OF THE INVENTION

This invention relates to semiconductor devices, and more particularly, to semiconductor devices with silicided source/drains.

RELATED ART

In common semiconductor manufacturing, semiconductor devices are made with lightly-doped drains at the junction with the channel and a relatively higher doped drain region used for making contact. The sources are made in the same way. The contact to the drain is made using a metal silicide. This contact is achieved by depositing the metal layer then reacting the metal layer with the silicon of the heavily-doped drain contact region to form a metal silicide contact region. The unreacted metal, which is located in the regions where there is no silicon, is then etched away with an etchant that is selective to the metal silicide. This metal silicide is then the contact point for the source and the drain of the semiconductor device.

One effective metal has been found to be cobalt. Cobalt is effective but has been found to be difficult to use for very small polysilicon dimensions. Thus, with cobalt there have been problems with achieving reliable and continuous cobalt silicide formed on narrow polysilicon lines. This is even called the "line width effect." Thus, other metals have been studied to overcome this problem. One promising metal is nickel. The use of nickel to form nickel silicide is effective for narrower line widths than have been found to be achievable for cobalt silicide. A difficulty with nickel silicide, however, has been the spiking of the nickel silicide to below the targeted depth in the form of inverted pyramids. The nickel atoms tend to continue to extend along a downward path that may extend below the drain. When this spiking occurs, it has been found that the silicide structure is nickel disilicide. The formation of this nickel disilicide has been particularly difficult to control for the semiconductor devices that are P channel transistors. Dopant atoms, such as boron that are smaller than silicon atoms, induce contraction of the silicon lattice. This causes the silicon substrate lattice to match with the lattice of the nickel disilicide thus causing nucleation of the nickel disilicide phase instead of the nickel monosilicide phase that would have formed had there been no lattice contraction.

Thus, there is a need for a technique for forming nickel silicide on source/drains that has improved manufacturability for P channel transistors.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect a relatively deep germanium implant and activation thereof precedes deposition of the nickel that is used to form nickel silicide. The activation of the germanium causes the lattice constant in the region of the implant to be increased over the lattice constant of the background substrate, which is preferably silicon. The effect is that the lattice so altered avoids formation of nickel disilicide. The result is that nickel silicide spiking is avoided. This is better understood with reference to the FIGS. and the following description.

Figure 1:
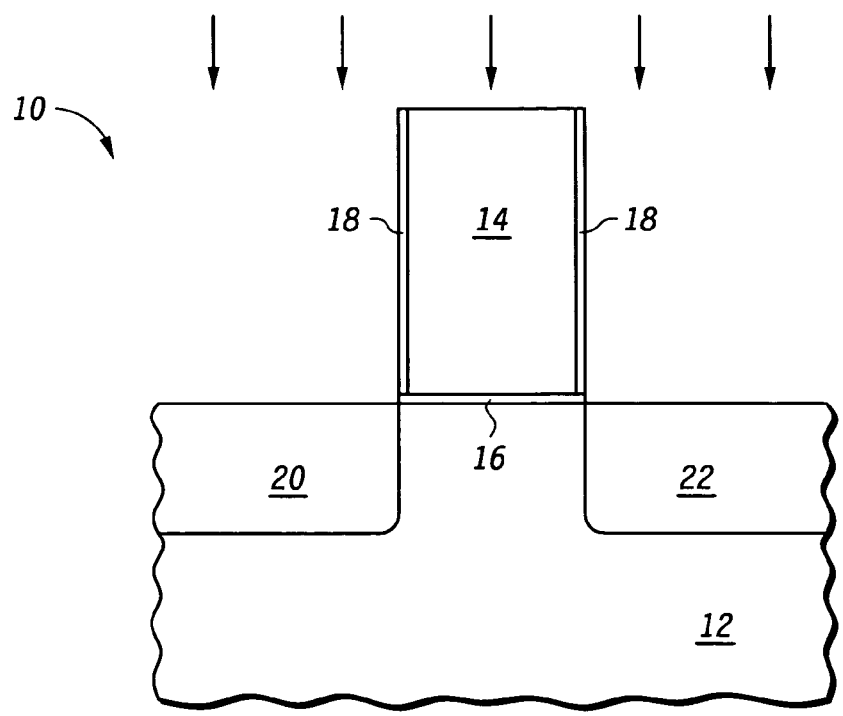
FIGS. 1-7 are cross sections of a semiconductor device at sequential stages in processing according to an embodiment of the invention.

Shown in FIG. 1 is a semiconductor device 10 comprising a semiconductor substrate 12, a gate 14 on a gate dielectric 16, and a liner 18 around gate 14 receiving a germanium implant. The result of the implant and subsequent anneal is the formation of modified lattice regions 20 and 22. Semiconductor device 10 is, in this example, being made into a P channel transistor. Substrate 12 is preferably silicon doped to N- so as to form an N well region. This may be achieved by starting with a bulk P- substrate and selectively doping active regions to N- for formation of P channel transistors in which case substrate 12 is a well region within a larger substrate. Liner 18 is formed by an oxidation step. An antireflective coating (ARC), which is present for other reasons, prevents oxidation on the top of gate 14 and is then removed. Regions 20 and 22 are adjacent to gate 14, since gate 14 acts as a mask during germanium implant that forms regions 20 and 22. The region in substrate 12 between regions 20 and 22 is where the channel of the P channel transistor is to be located. Regions 20 and 22, after being annealed, have a lattice that is stretched compared to a silicon-only lattice structure. The stretched lattice has a spacing that is larger than that of nickel disilicide, which makes formation of nickel disilicide difficult. The germanium implant in the present embodiment is preferably at least 3 Kev at a dose of at least 10 to the $13^{th}$ (1E13) atoms per centimeter squared. One example is 10 Kev at 1E15 atoms per centimeter square. Preferably the energy should not exceed 50 Kev, but it could be higher. The dose preferably does not exceed 1E17 atoms per centimeter square but could be greater than that. The anneal, which causes the activation of the germanium, is preferably between 900 and 1400 degrees Celsius. The activation can occur at an even lower temperature, such as 550 degrees Celsius. One example of an effective anneal is 1050 degrees Celsius for 5 seconds.

Figure 2:
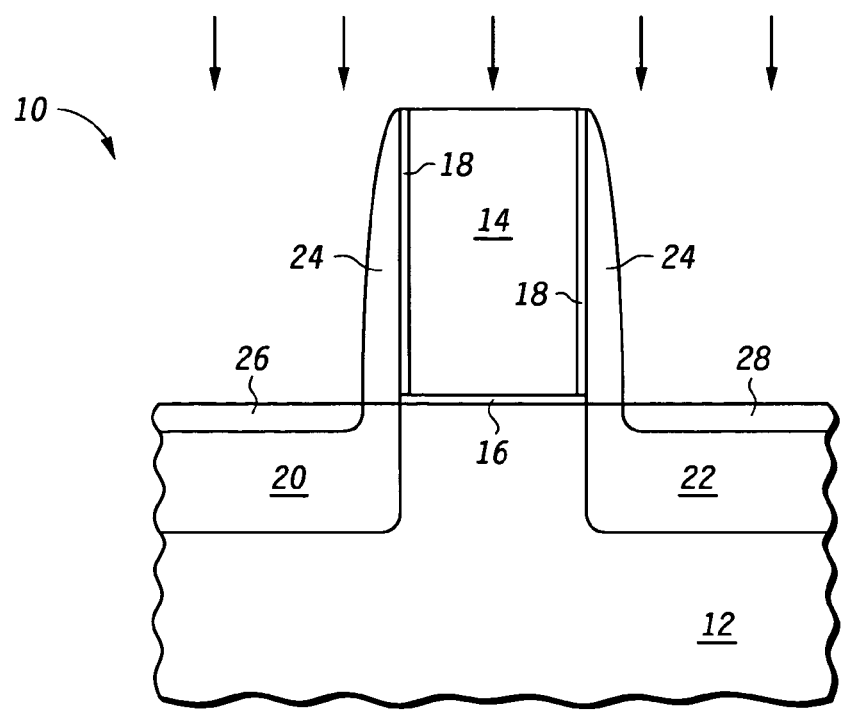

Shown in FIG. 2 is device 10 after formation of sidewall spacer 24 around gate 14 and a source/drain implant of boron to form source/drain regions 26 and 28 using gate 14 and sidewall spacer 24 as a mask. A boron implant may be in the form of boron difluoride. Most of the boron remains and most of the fluorine outgases during subsequent thermal processes. This implant is sometimes referred to as an extension implant. This forms the extension source/drain regions 26 and 28 that are at the interface with the channel of the ultimate P channel transistor that is formed. This formation of source/drain regions 26 and 28 are within modified lattice regions 20 and 22, respectively. But for the presence of regions 20 and 22, this formation of extension regions 26 and 28 is well known in the art of semiconductor processing.

Figure 3:
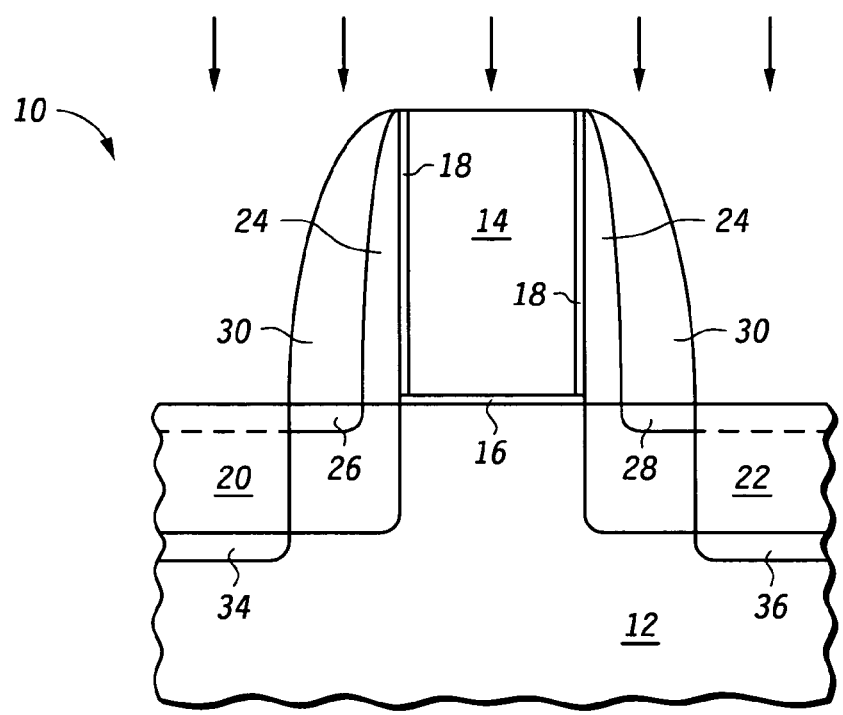

Shown in FIG. 3 is device 10 after formation of sidewall spacer 30 around sidewall spacer 24 and a source/drain implant of boron to form source/drain contact regions 34 and 36 using gate 14, sidewall spacer 24, and sidewall spacer 30 as a mask. Sidewall spacer 30 may be a composite of more than one layer. For example this could be an oxide layer followed by a nitride layer. In this case, regions 34 and 36 extend below modified lattice regions 20 and 22. Especially in SOI substrates, there is also the possibility that the contact source/drain implant and the germanium implant will terminate at the interface of the semiconductor layer and the insulating layer that is below the semiconductor layer. These source/drain contact regions 34 and 36 are also known as deep source/drains and, but for the presence of modified lattice regions 20 and 22, the formation of source/drain contact regions 34 and 36 is well known in the art of semiconductor processing.

Figure 4:
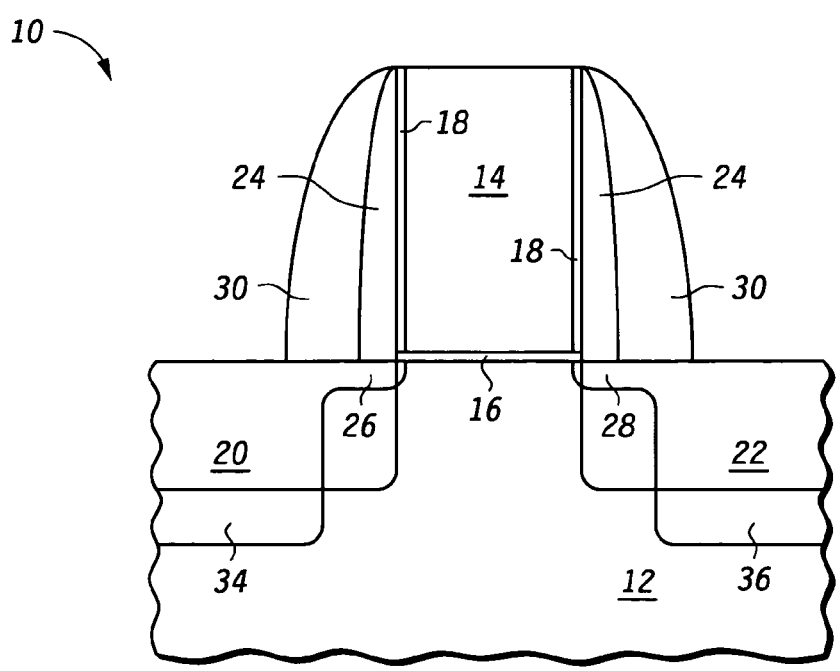

Shown in FIG. 4 is semiconductor device 10 after annealing the source/drain implants as shown in FIGS. 2 and 3. This activates these implants and has the effecting of expanding regions 26, 28, 34, and 36. The extension regions, source/drain regions 26 and 28, expand to be at least aligned to the edges of gate 14. The anneal will cause regions 28 and 36 and regions 26 and 34 to have a gradual change, if any, in doping concentration so they effectively merge into single regions. But for the presence of modified lattice regions 20 and 22, the process described for FIG. 4 is well known in the art of semiconductor manufacturing.

Figure 5:
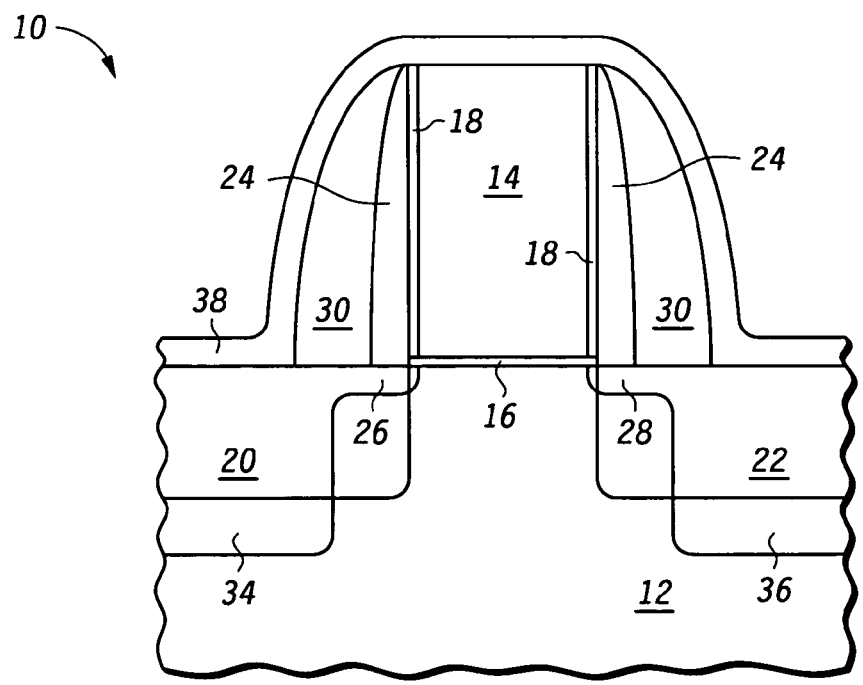

Shown in FIG. 5 is semiconductor device 10 after deposition of metal layer 38 that, in this example, is nickel. This layer 38 is in direct contact with source/drain regions 34 and 36, gate 14, and sidewall spacer 30.

Figure 6:
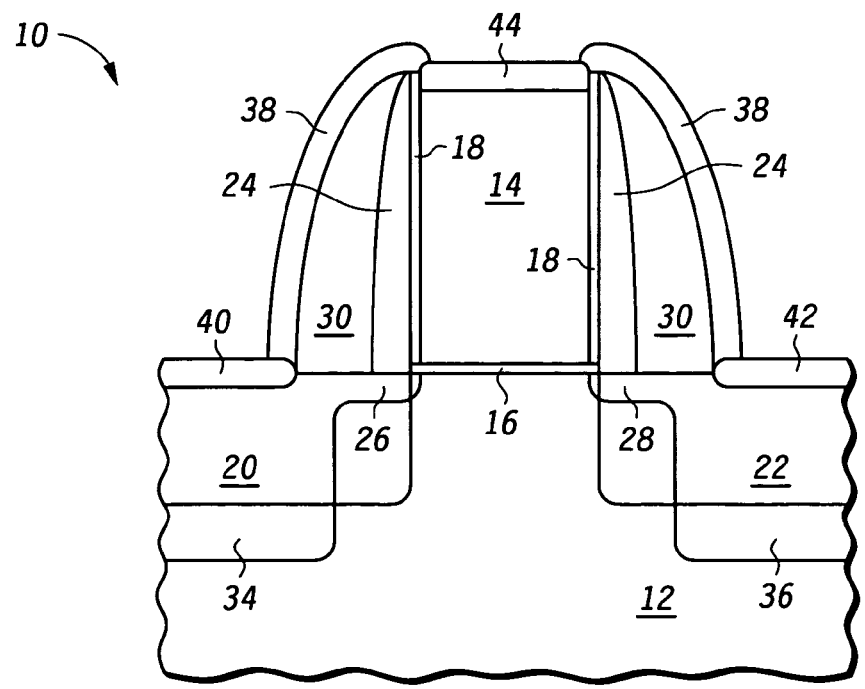

Shown in FIG. 6 is semiconductor device 10 after a heating step to cause the formation of nickel silicide where nickel layer 38 is in contact with silicon. The result is the formation of silicide region 40 over and in source/drain region 34, a silicide region 42 over and in source/drain region 36, and a silicide region 44 over and in gate 14. These silicide regions 40, 42, and 44 are contacts that are effective for making an electrical connection as desired.

Figure 7:
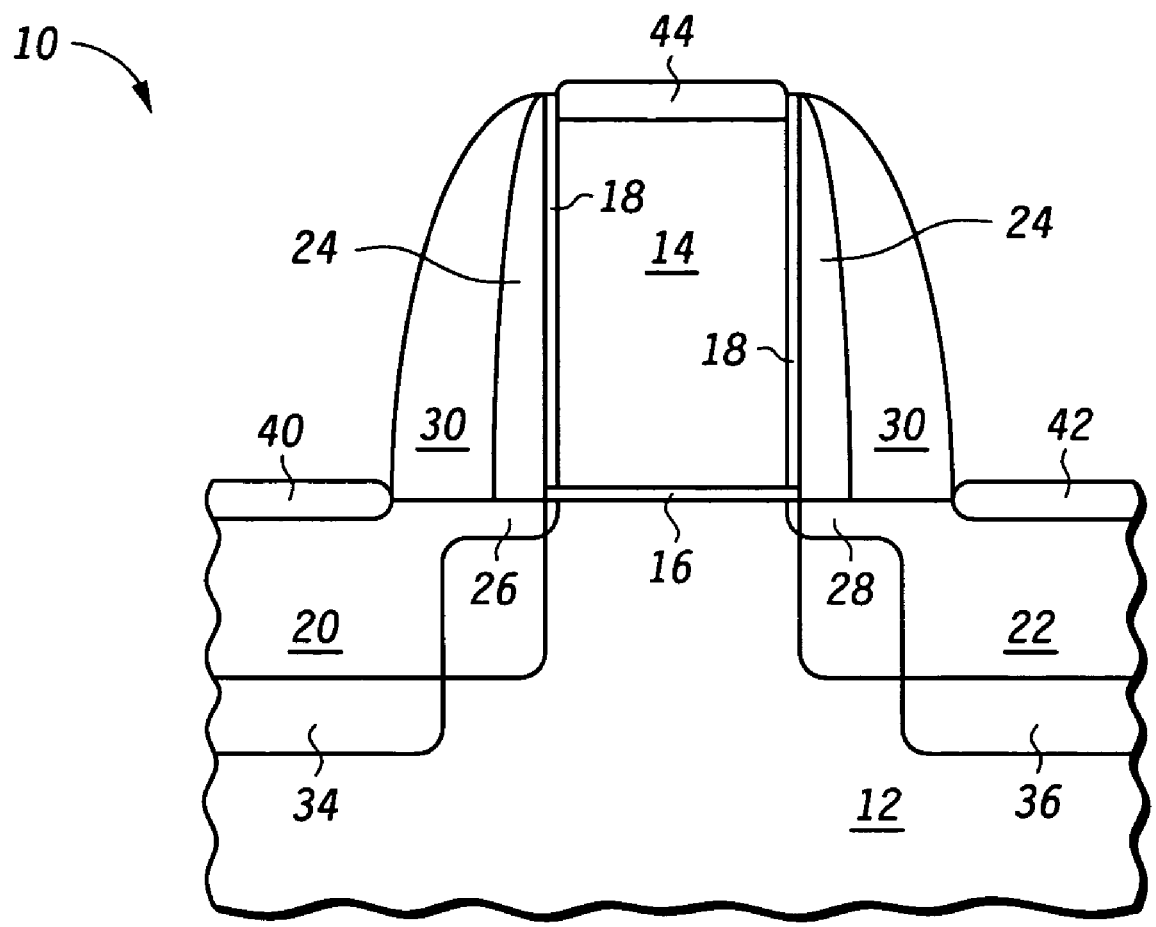

Shown in FIG. 7 is semiconductor device 10 after removal of the portion of layer 38 that was not silicided. This is achieved using an etchant, such as piranha, that is selective between the metal, which is nickel in this case, and the metal silicide, which is nickel silicide in this case. The device may then be subjected to an additional anneal to complete the silicide formation if so desired. This last anneal, however, may or may not be necessary depending on the process technology used in device fabrication. But for the presence of modified lattice regions 20 and 22, the steps described for FIGS. 5-7 are well known in the art of semiconductor manufacturing.

An alternative embodiment is to wait to perform the germanium implant until after the formation of the sidewall spacer that is used for the deep source/drain implant for making contacts. In such case the extension implant is performed prior to the germanium implant that forms the extension source/drain regions, the sidewall spacer for the deep source/drain implant is formed, and then the germanium implant is performed. This results in the germanium implant region being offset further from the channel than for regions 20 and 22 of FIG. 2. After the germanium implant and before the deep source/drain implant, the germanium implant is activated with a very short but high temperature anneal, which can be considered a non-diffusing anneal. Exemplary anneals are flash anneal and laser annealing. Flash annealing utilizes an arc lamp that provides very fast ramp rates for the heat. The intent is to increase the lattice constant in the area of the germanium implant without causing the extension regions to diffuse toward each other in the channel region. After formation of the modified lattice region, the deep source/drain implant is performed. The lightly-doped and heavily-doped regions can then be activated using standard techniques for that. The subsequent silicide formation is thus over a region in which the lattice constant has been increased to avoid the nickel silicide spiking.

Thus, the regions of increased lattice constant, such as regions 20 and 22 which at least have portions in the source/drain contact regions, are useful in preventing spiking of nickel silicide and may be effective for preventing the spiking or the encroachment of other metal silicides such as cobalt silicide. The increased lattice constant regions in this described example are about 400 angstroms deep. It is preferred that the depth be greater than the silicide depth. Thus, the preferred smallest depth is at least the depth of the silicide. A greater depth than 400 angstroms should be effective as well. Activation of the germanium to form modified lattice regions 20 and 22 may occur at any time prior to formation of the silicide regions, but it is preferred that it occur before the implanting of the source/drain regions 26, 28, 34, and 36. Delaying the activation of the modified lattice regions 20 and 22 until after the source/drain implants causes competition with the source/drain implant dopants for the lattice sites. This can result in the lattice not being sufficiently modified to achieve the desired effect. Germanium has been found to be effective in avoiding spiking but other implanted materials may be effective as well. For example, other materials that may be effective include gallium, arsenic, indium, tin, antimony, thallium, lead, bismuth, zinc, cadmium, mercury, selenium, tellurium, and polonium. These materials all have a larger atomic radius than silicon and are in group II, III, IV, V, or VI, which are known to be able to be activated and occupy substitutional sites in a silicon lattice. In order to increase the lattice constant, any of these species or any combination of these species can be used to achieve the desired result.

In the foregoing specification, the invention has been described with reference to specific embodiments. However, one of ordinary skill in the art appreciates that various modifications and changes can be made without departing from the scope of the present invention as set forth in the claims below. For example, there may be other ways to modify the lattice constant of the substrate that has the needed characteristics. Also the source/drain contact regions may be in a region that is elevated above the plane of the substrate. These are called elevated source/drains. In such case the implant into the source/drain contact region to increase the lattice constant will be into the elevated region and the silicide will be formed on the elevated regions as well. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a contact to a source/drain contact region of a transistor device having a gate, and the source/drain contact region is comprised substantially of silicon, the method comprising:
   implanting germanium into a region of the source/drain contact region at a dose between 1E13 and 1E17 atoms per centimeter squared using the gate as a mask;
   activating the germanium implanted into the source/drain contact region;
   implanting boron into the source/drain contact, wherein the implanting the boron is performed subsequent to the activating the germanium; and
   forming a nickel silicide over the source/drain contact region after the activating to form the contact.

2. The method of claim 1 wherein the activating the germanium further includes activating the germanium in order to make the germanium substitutional in a lattice of the source/drain contact region, wherein the lattice includes silicon.

3. The method of claim 1 wherein the activating the germanium increases a lattice constant of the lattice in the source/drain contact region.

4. The method of claim 1 wherein the activating includes heating the source/drain contact region to a temperature of greater than 550 C.

5. The method of claim 1 wherein the activating further includes rapid thermal annealing of the source/drain contact region.

6. The method of claim 1 wherein the activating further includes laser annealing of the source/drain contact region.

7. The method of claim 1 wherein the activating further includes arc lamp thermal annealing of the source/drain contact region.

8. The method of claim 1 wherein the activating further includes gas convection annealing of the source/drain contact region.

9. The method of claim 1 wherein the implanting the is performed at a temperature between 25 and 600 degrees Celsius.

10. The method of claim 1 further comprising:
    forming a sidewall spacer adjacent to a sidewall of the gate, wherein the implanting the germanium is performed prior to the forming the sidewall spacer.

11. The method of claim 10 wherein the forming the sidewall spacer is performed prior to the implanting the source/drain dopant.

12. The method of claim 1 wherein the gate is over a semiconductor substrate, the source/drain contact region is in the semiconductor substrate, and the source/drain contact region is disposed laterally from the gate.

13. The method of claim 12 further comprising implanting a second source/drain dopant in the semiconductor substrate after the implanting the source/drain dopant, wherein the second source/drain dopant is implanted deeper than the source/drain dopant.

14. The method of claim 12 wherein the implanting the germanium further includes implanting with an energy of at least 3 keV.

15. The method of claim 12 wherein the implanting the germanium further includes implanting with an energy in the range of 3 keV to 50 keV.

16. The method of claim 12 wherein the implanting the partieles germanium is performed at a temperature between 25 and 600 degrees Celsius.

17. The method of claim 1, wherein:
    the transistor has a second source/drain contact;
    the implanting of the further includes implanting the germanium into the second source/drain contact region at the dose between 1E13 and 1E17 atoms per centimeter squared;
    the activating of the germanium further includes activating the germanium implanted into the second source/drain contact region;
    the implanting boron further includes implanting the boron into the second source/drain contact region; and
    forming a second nickel silicide over the second region to form a second contact.

18. The method of claim 1, wherein the gate is over a semiconductor substrate and a channel is in the substrate under the gate, further comprising forming a source/drain extension adjacent to the channel in the semiconductor substrate.

19. The method of claim 18, wherein the forming comprises implanting a second source/drain dopant into the substrate for forming the source/drain extension, wherein the implanting the second source/drain dopant is performed prior to the implanting the boron.

20. The method of claim 1 further comprising activating the boron.

21. A method of forming a contact to a source/drain contact region of a transistor device having a gate, and the source/drain contact region is comprised substantially of silicon, the method comprising:
    implanting germanium into a region of the source/drain contact region at a dose between 1E13 and 1E17 atoms per centimeter squared using the gate as a mask;
    activating the germanium implanted into the source/drain contact region;
    implanting boron into the source/drain contact, wherein the implanting the boron is performed subsequent to the activating the germanium; and
    forming a nickel silicide over the source/drain contact region after the activating to form the contact;
    wherein the activating includes heating the source/drain contact region to a temperature of greater than 1000 C.

22. A method of forming a contact to a source/drain contact region of a transistor device having a gate, and the source/drain contact region is comprised substantially of silicon, the method comprising:
    implanting germanium into a region of the source/drain contact region at a dose between 1E13 and 1E17 atoms per centimeter squared using the gate as a mask;
    activating the germanium implanted into the source/drain contact region;
    implanting boron into the source/drain contact, wherein the implanting the boron is performed subsequent to the activating the germanium; and
    forming a nickel silicide over the source/drain contact region after the activating to form the contact;
    wherein the activating further includes heating the source/drain contact region to a temperature in a range of approximately 900-1400 C.

23. A method of forming a semiconductor device, the method comprising:
    forming a gate over a silicon substrate, the substrate having a lattice constant;
    increasing the lattice constant of the lattice in a source/drain region of the substrate after the forming the gate by implanting germanium at a dose between 1E13 and 1E17 using the gate as a mask;

implanting a boron into the source/drain region, wherein the implanting the boron is performed subsequent to the increasing the lattice constant; and forming a nickel silicide over the portion of the source/drain region.

24. A method of forming a semiconductor device, the method comprising:

forming a gate over a silicon semiconductor substrate;

implanting particles including germanium into a region of the substrate after the forming the gate at a dose between 1E13 and 1E17 atoms per centimeter squared using the gate as a mask;

activating the germanium implanted into the region;

implanting boron into the substrate for forming at least a portion of a source/drain region in the substrate, wherein the implanting the boron is performed subsequent to the activating the germanium; and forming a nickel silicide over the region after the activating.

25. In a transistor device structure having a gate stack and source/drain contact regions comprised primarily of a first material, wherein the source/drain contact regions have a lattice constant, a method of forming a contact, comprising:

implanting germanium at a dose between 1E13 and 1E17 atoms per centimeter squared into the source/drain contact regions using the gate stack as a mask;

activating the germanium implanted into the source/drain contact regions to increase the lattice constant of the source/drain contact regions;

implanting boron into the source/drain contact regions after the step of activating; and forming a nickel silicide over the source/drain contact regions after the step of activating.

* * * * *

UNITED STATES PATENT AND TRADEMARK OFFICE
CERTIFICATE OF CORRECTION

PATENT NO. : 7,262,105 B2  
APPLICATION NO. : 10/718892  
DATED : November 21, 2003  
INVENTOR(S) : Dharmesh Jawarani It is certified that error appears in the above-identified patent and that said Letters Patent is hereby corrected as shown below:

In Column 5, Line 38, Claim 9:

Change "implanting the is" to --implanting the germanium is--

In Column 5, Line 64, Claim 16:

Remove "partieles"

In Column 6, Line 3, Claim 17:

Change "implanting of the further includes" to --implanting of the germanium further includes--

Signed and Sealed this

Twentieth Day of May, 2008

JON W. DUDAS  
*Director of the United States Patent and Trademark Office*

UNITED STATES PATENT AND TRADEMARK OFFICE
CERTIFICATE OF CORRECTION

PATENT NO.       : 7,262,105 B2                                    Page 1 of 1
APPLICATION NO.  : 10/718892
DATED            : August 28, 2007
INVENTOR(S)      : Dharmesh Jawarani It is certified that error appears in the above-identified patent and that said Letters Patent is hereby corrected as shown below:

In Column 5, Line 38, Claim 9:

Change "implanting the is" to --implanting the germanium is--

In Column 5, Line 64, Claim 16:

Remove "partieles"

In Column 6, Line 3, Claim 17:

Change "implanting of the further includes" to --implanting of the germanium further includes--

This certificate supersedes the Certificate of Correction issued May 20, 2008.

Signed and Sealed this

Seventeenth Day of June, 2008

JON W. DUDAS
*Director of the United States Patent and Trademark Office*